United States Patent
Pearson et al.

(10) Patent No.: US 7,962,304 B2
(45) Date of Patent: Jun. 14, 2011

(54) DEVICE FOR THOROUGH TESTING OF SECURE ELECTRONIC COMPONENTS

(75) Inventors: Eric C. Pearson, Conestogo (CA); Michael A. Howard, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 529 days.

(21) Appl. No.: 12/112,182

(22) Filed: Apr. 30, 2008

(65) Prior Publication Data
US 2009/0037133 A1 Feb. 5, 2009

Related U.S. Application Data

(60) Provisional application No. 60/963,287, filed on Aug. 2, 2007.

(51) Int. Cl.
*G06F 19/00* (2011.01)
(52) U.S. Cl. ....................................................... 702/120
(58) Field of Classification Search .................. 702/120, 702/182–185, 188
See application file for complete search history.

(56) References Cited

U.S. PATENT DOCUMENTS

| | | | | |
|---|---|---|---|---|
| 5,357,572 | A | 10/1994 | Bianco et al. | 380/23 |
| 7,757,084 | B2 * | 7/2010 | Walmsley et al. | 713/168 |
| 2005/0066189 | A1 | 3/2005 | Moss et al. | 713/200 |

* cited by examiner

*Primary Examiner* — Edward Raymond
(74) *Attorney, Agent, or Firm* — Christopher P. Maiorana, PC

(57) ABSTRACT

An apparatus including a test circuit, an output circuit and a control circuit. The test circuit may be configured to generate test data in response to one or more test vectors. The output circuit may be configured to present data in a first mode and prevent presentation of data in a second mode. The output circuit may be configured to switch between the first mode and the second mode in response to a control signal. The control circuit may be configured to generate the control signal according to predetermined criteria for protecting secure data within the apparatus while allowing the test data to be presented.

17 Claims, 3 Drawing Sheets

DEVICE FOR THOROUGH TESTING OF SECURE ELECTRONIC COMPONENTS

This application claims the benefit of U.S. Provisional Application No. 60/963,287, filed Aug. 2, 2007 and is hereby incorporated by reference in its entirety.

FIELD OF THE INVENTION

The present invention relates to electronic device testing generally and, more particularly, to a method and/or apparatus for thorough testing of secure electronic components.

BACKGROUND OF THE INVENTION

Secure electronic devices can be designed for use by select users. Unauthorized users who are not permitted to use the secure electronic device are prevented from using the device by logic within the device. However, if the unauthorized users could review the rules that disallow the unauthorized users from using the secure electronic device, the unauthorized users could circumvent the rules and use the device without authorization.

In particular, during thorough testing of the secure electronic devices, it is possible to inadvertently divulge the contents of the secure logic. Despite the possibility of divulging the contents of the secure logic, it is necessary to thoroughly test devices, including the secure logic, before sending them to users.

Referring to FIG. 1, a block diagram of a device 10 is shown. The device 10 has an input 12, an input 14, an output 16 and an output 18. The inputs 12 and 14 and the outputs 16 and 18 can be part of a test access port (TAP) of the device 10. The input 12 is used to input test vectors TDI. The input 14 is used to input a shift enable signal (or instruction) SHFT_EN. The output 16 presents an output of a test instruction serial shift register (or scan chain) 20. The output 18 presents an output TDO of a test result serial shift register (or scan chain) 22.

Logic 24 can be connected between the chain 20 and the chain 22. In one example, the shift input 14 is used to shift in test vectors from the input 12 to the chain 20. The test vectors in the chain 20 may be presented to inputs of the logic 24. The logic 24 may generate outputs in response to the test vectors presented at the inputs. The outputs of the logic 24 may be stored in the chain 22. Contents of the chain 22 may be shifted out via the output 18 in response to the shift enable signal received at the input 14.

Testing of a device using the scan chains is a common test technique to achieve thorough testing of electronic devices. All of the registers in a design are put into a serial chain, so that data can be serially applied to the device. The device is put into a normal mode, the response(s) to the serially applied data collected, and the device put back into the serial mode to shift the response(s) out.

In the device 10, a "11" sequence is loaded into the serial chain 20, and a response of "1" is collected in a register R1 in the serial chain 22. The contents of the chains 20 and 22 are shifted in/out when the signal SHFT_EN is asserted. If the signal SHFT_EN is not asserted, the contents of the register R1 cannot be observed at the chip output 18. In general, for the register R1 to be shifted out to be observed, the contents of registers R2 and R3 also become visible. If the registers R2 and R3 contain secure data, the secure data may be divulged in the process of observing the register R1.

There is a need for thorough testing of secure logic, without divulging any secrets that would allow unauthorized users to use the device.

SUMMARY OF THE INVENTION

The present invention concerns an apparatus including a test circuit, an output circuit and a control circuit. The test circuit may be configured to generate test data in response to one or more test vectors. The output circuit may be configured to present data in a first mode and prevent presentation of data in a second mode. The output circuit may be configured to switch between the first mode and the second mode in response to a control signal. The control circuit may be configured to generate the control signal according to predetermined criteria for protecting secure data within the apparatus while allowing the test data to be presented.

The objects, features and advantages of the present invention include providing a method and/or apparatus for thorough testing of secure electronic components that may (i) clear out contents of all secure logic before testing begins, (ii) prevent a device from entering a test mode until all of the secure data is removed, (iii) allow only the contents of the device that result from testing to be visible to a user, (iv) work with scan chains and/or (v) disable outputs of a device until secure data is destroyed.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention generally provides a method and/or an apparatus for clearing out the contents of all secure logic before testing of a device (or chip) begins. In one example, the device being tested may be prevented from entering into a test mode until all of the secure data has been removed from the device. Once testing begins, only the contents of the device that result from the tests applied may be visible to any user. The present invention may prevent users from determining any secret (or secure) information contained within a device.

Figure 2:
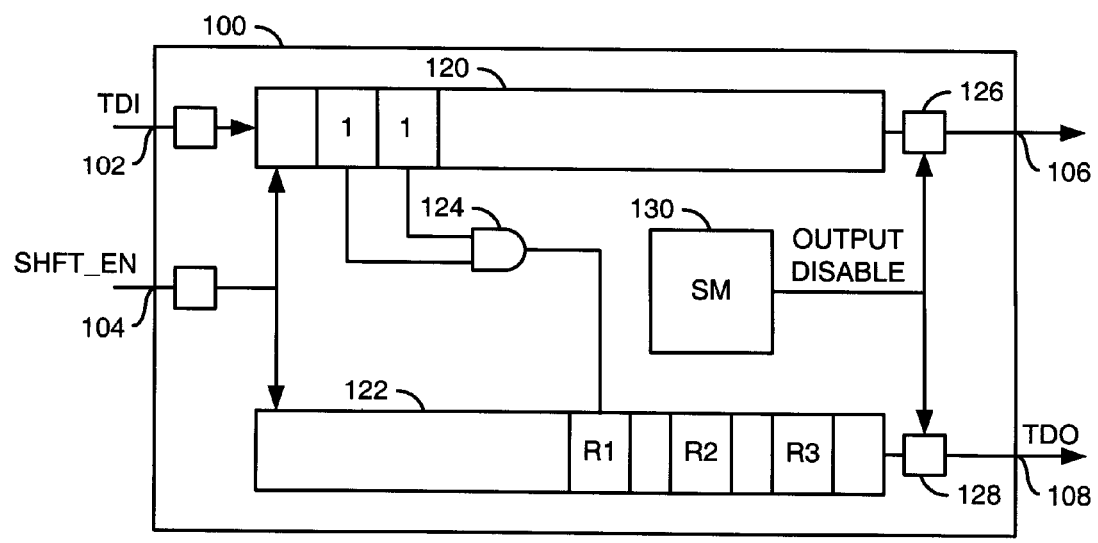
FIG. 2 is a diagram illustrating an example scan chain modified in accordance with the present invention.

Referring to FIG. 2, a diagram is shown illustrating a secure electronic device 100 implemented in accordance with a preferred embodiment of the present invention. In one example, the device 100 may have an input 102, an input 104, an output 106 and an output 108. The input 102 may be configured to receive test vector data (e.g., TDI). The input 104 may be configured to receive a test shift enable signal (e.g., SHFT_EN). The output 106 may be configured to present the test vector data TDI subsequent to its use in testing. The output 108 may be configured to present test result information (e.g., TDO). The test result information TDO is generated by the device 100 in response to the test vector data TDI. In one example, the inputs 102 and 104 and the outputs 106 and 108 may be implemented as part of a test access port (TAP) of the device 100. In another example, the inputs 102 and 104 and the outputs 106 and 108 may share functions between test circuitry and normal operating circuitry of the device 100.

Figure 1:
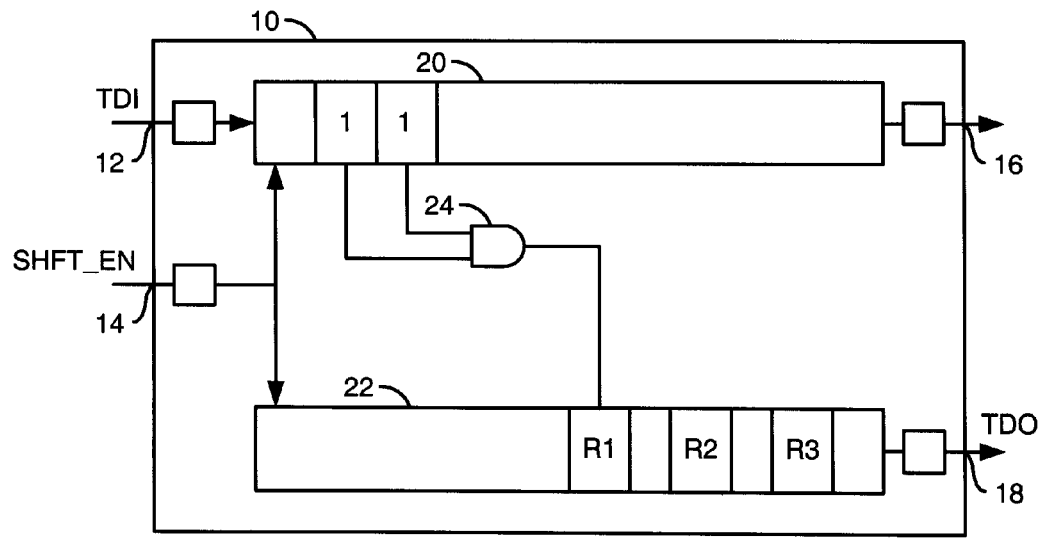
FIG. 1 is a diagram illustrating an example scan chain.

In one example, the device 100 may comprise a scan chain 120, a scan chain 122, logic 124, an I/O pad 126, an I/O pad 128 and a control module 130. The scan chains 120 and 122 and the logic 124 may operate similarly to the chains 20 and 22 and logic 24 of FIG. 1. The scan chains 120 and 122 and the logic 124 generally form a test circuit of the device 100. An output of the chain 120 may be presented to an input of the I/O pad 126. An output of the I/O pad 126 may be presented at the output 106 of the device 100. An output of the chain 122 may be presented to an input of the I/O pad 128. An output of the I/O pad 128 may be presented at the output 108 of the device 100. The I/O pads 126 and 128 generally form an output circuit of the device 100. The I/O pads 126 and 128 may have a control input that may receive a signal (e.g., OUTPUT_DISABLE) from an output of the control module 130. In one example, the signal OUTPUT_DISABLE may be implemented as an output enable control signal. In one example, the control module 130 may be implemented using a state machine.

In one example, the scan chain 122 may include registers (e.g., R2, R3, etc.) that may contain secure (or secret) data. The present invention may provide a method and/or apparatus to remove the contents of the registers R2 and R3 to prevent the secure data from being disclosed. In one example, the contents of the registers R2 and R3 simply may be shifted out before testing begins. Shifting out the contents may empty out the registers, but the contents should not be visible at the I/Os of the device 100. In one example, the contents may be prevented from becoming visible by disabling the I/Os so that the I/Os cannot transmit data during the time the registers R2 and R3 are being shifted out. Disabling the I/Os generally ensures that the secure contents of, for example, the registers R2 and R3 does not become visible to anyone. For example, once the register contents of the registers R2 and R3 has been cleared out, it is possible to test the device completely, without revealing the secret contents of the registers R2 and R3.

Figure 3:
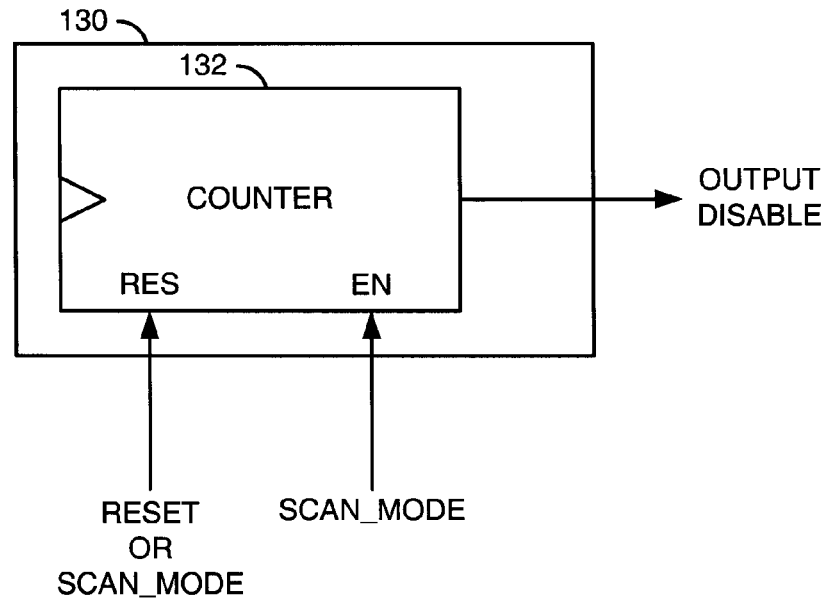
FIG. 3 is a diagram illustrating an example of a state machine in accordance with the present invention.

Referring to FIG. 3, a block diagram is shown illustrating an example of the control module 130 of FIG. 2 implemented in accordance with a preferred embodiment of the present invention. In one example, the control module 130 may comprise a state machine implemented with a counter 132. The counter 132 may have a first input that may be configured to reset the counter 132 and a second input that may be configured to enable the counter 132. The counter 132 may also have an output that may present the signal OUTPUT_DISABLE. In one example, a signal (e.g., RESET or SCAN_MODE) may be presented to the first input of the counter 132. The signal RESET or SCAN_MODE may be received from a reset detection circuit (not shown) that may be configured to reset the counter in response to either a chip reset signal being asserted or the scan test mode being activated.

The signal SCAN_MODE may be presented to the second input of the counter 132. When the signal SCAN_MODE is asserted (e.g., indicating scan test mode to be active), the counter 132 may be enabled to count. When the counter 132 is reset, the signal OUTPUT_DISABLE is generally asserted. When the counter 132 reaches a predetermined value, the signal OUTPUT_DISABLE is generally disasserted. When the signal OUTPUT_DISABLE is asserted, the I/O pads 126 and 128, and any other I/O pads of the device 100 receiving the signal OUTPUT_DISABLE, generally operate in accordance with a predefined disabled mode. When the signal OUTPUT_DISABLE becomes inactive, the I/O pads 126 and 128, and any other I/O pads of the device 100 receiving the signal OUTPUT_DISABLE, generally behave (operate) as defined by the chip specification (e.g., in accordance with a normal operating mode). The predetermined value at which the signal OUTPUT_DISABLE becomes inactive is generally determined based upon the amount of time it takes to shift out (destroy) all secure data in the device.

In general, the enables on the I/O pads do not turn on until the state machine allows them to turn on. The state machine 130 generally ensures that the I/O pads are disabled during an initial shift of the scan chains. Once all chains have been emptied, the outputs may be enabled. At this point, the contents of the secure registers (e.g., R2 and R3) has been destroyed, and there is no loss of secure data when subsequent testing takes place. The state machine 130 is generally configured with how many cycles to wait until the output enables are asserted. The amount of time for the delay is generally determined by the minimum number of cycles required to shift out all of the secure data.

The operation of the state machine 130 should be carefully defined. The state machine 130 should be informed when scan mode testing has been requested, but has not yet started. If the state machine is not aware of the scan mode status, a test that is in progress could be destroyed by disabling the outputs at the wrong time.

Upon entry to scan test mode, a reset detection circuit (not shown) resets the counter 132 in the state machine (or control module) 130. When the counter 132 senses scan test mode to be true (e.g., by assertion of the signal SCAN_MODE), the counter 132 starts counting. During the time the counter 132 is counting, the outputs are disabled (e.g., the signal OUTPUT_DISABLE is asserted). When the counter 132 reaches the predetermined value, the signal OUTPUT_DISABLE becomes inactive, and the outputs behave (operate) as defined by the chip specification.

The state machine 130 is generally not active when the device 100 is not in the scan test mode, so the state machine 130 does not interfere with normal circuit operation. An example illustrating when the counter 132 is active may be summarized as in the following TABLE 1:

TABLE 1

| ScanMode | Reset | I/O Pad Output State | Counter |
| --- | --- | --- | --- |
| 1 | Not active | disabled | Counting |
| 1 | Active | disabled | Reset |
| 0 | Not active | Per system spec. | Reset |
| 0 | Active | Per system spec. | Reset |
| 1 | Not active | Per system spec. | Halted |

Figure 4:
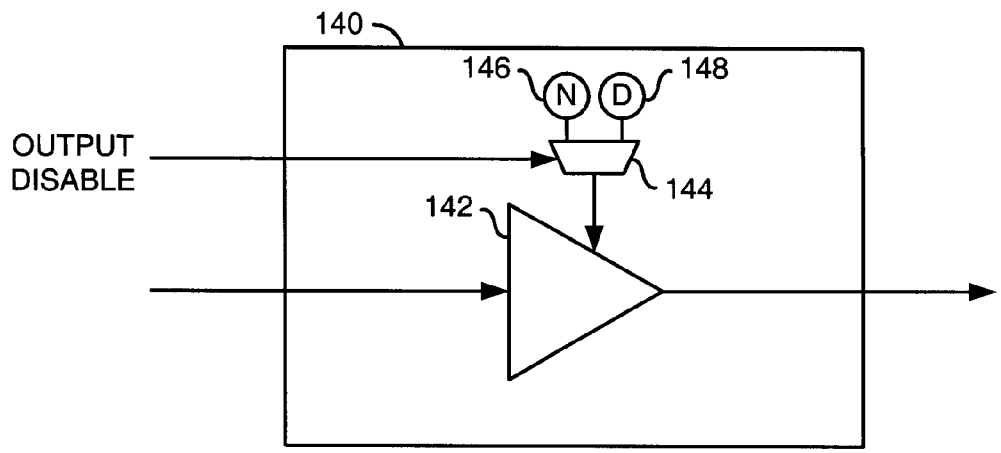
FIG. 4 is a diagram illustrating an example of an I/O pad in accordance with a preferred embodiment of the present invention.

Referring to FIG. 4, a diagram is shown illustrating an I/O pad 140 implemented in accordance with a preferred embodiment of the present invention. In one example, the I/O pads 126 and 128 may be implemented using the I/O pad 140. In one example, the I/O pad 140 may comprise a buffer 142 and a multiplexer 144. In one example, the buffer 142 may be implemented as a tri-stateable buffer (or output driver). An input of the buffer 142 may receive a signal from the input of the I/O pad 140 and an output of the buffer 142 may present a signal to the output of the I/O pad 140. A control input of the buffer 142 may receive a signal from an output of the multiplexer 144.

The multiplexer 144 may have a control input that may receive the signal OUTPUT_DISABLE from the control input of the I/O pad 140. The multiplexer 144 may also have a first data input that may receive a first value 146 and a second data input that may receive a second value 148. The first value 146 may comprise a value (or logic level) determined to place the buffer 142 in a normal operating mode. The second value 148 may comprise a value (or logic level) determined to place the buffer 142 in a disabled mode. In one example, the values 146 and 148 may be hardwired. In another example, the values 146 and 148 may be programmable. The multiplexer circuit 144 may be configured to select between the first value 146 and the second value 148 for presentation to the control input of the buffer 142 in response to the signal OUTPUT_DISABLE.

Figure 5:
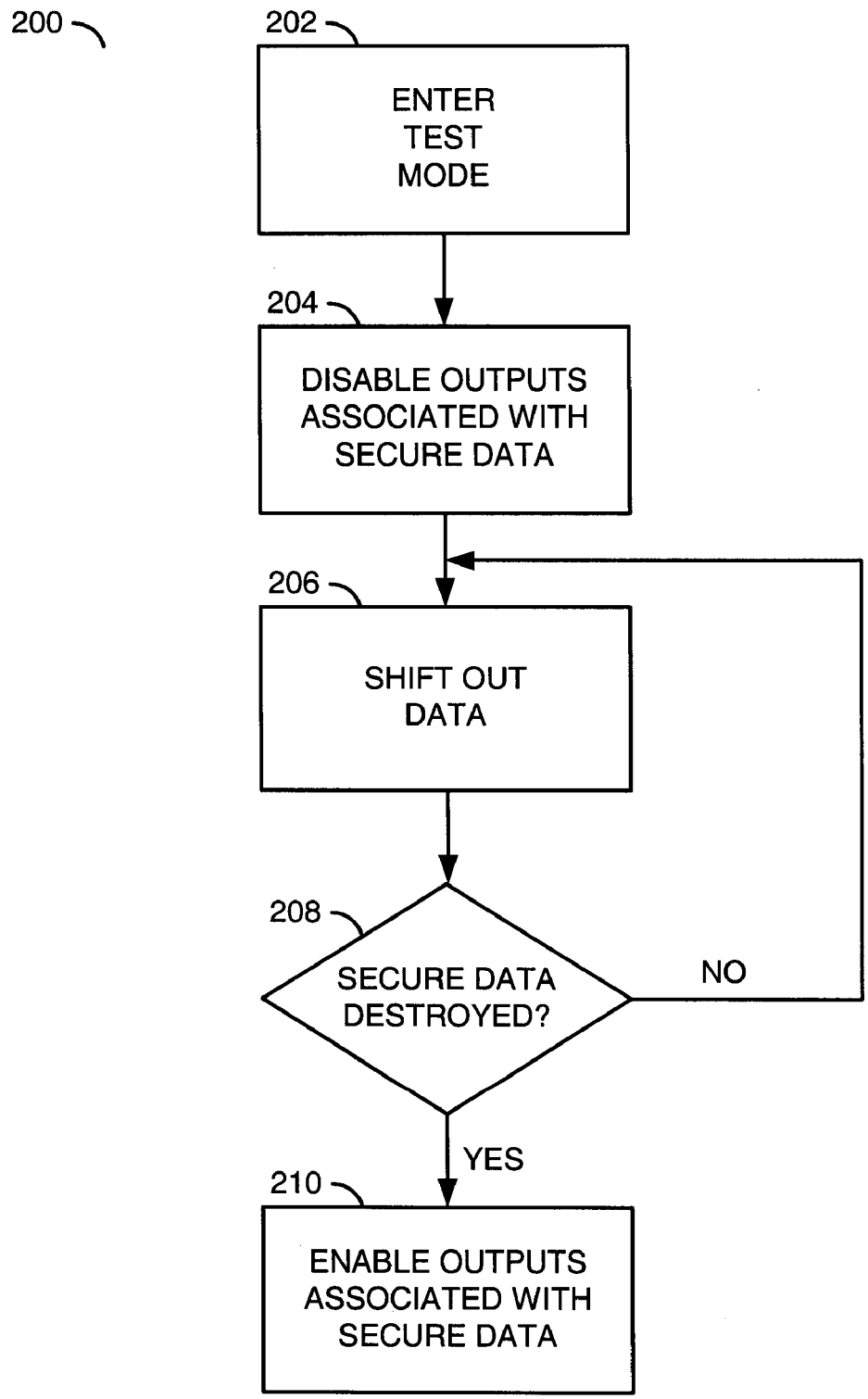
FIG. 5 is a flow diagram illustrating a test process in accordance with a preferred embodiment of the present invention.

Referring to FIG. 5, a flow diagram is shown illustrating a process 200 in accordance with an embodiment of a present invention. The process 200 may comprise a stage (or process) 202, a stage (or process) 204, a stage (or process) 206, a stage (or process) 208 and a stage (or process) 210. The stage 202 may be implemented as a test mode entrance stage. The stage 204 may be implemented as an output disable stage. The stage 206 may be implemented as a register chain shift stage. The stage 208 may be implemented as a decision stage. The stage 210 may be implemented as an output enable stage. In general, the process 200 begins by entering the stage 202 in response to a test mode of a secure electronic device being activated. The process 200 moves to the stage 204. In the stage 204, the process 200 disables all outputs associated with secure data within the secure electronic device. When the outputs have been disabled, the process 200 may move to the stage 206. In the stage 206, the process 200 shifts out data in the registers chains. In the stage 208, the process 200 checks to see if all secure data has been destroyed. If secure data is still in existence, the process 200 returns to the stage 206 and continues shifting out data. When the secure data has been destroyed, the process 200 moves to the stage 210. In the stage 210, the outputs previously associated with the secure data are enabled and the test process may continue.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) to meet the design criteria of a particular implementation. Additionally, inverters may be added to change a particular polarity of the signals.

While the invention has been particularly shown and described with reference to the preferred embodiments thereof, it will be understood by those skilled in the art that various changes in form and details may be made without departing from the scope of the invention.

The invention claimed is:

1. An apparatus comprising:
   a test circuit configured to generate test data in response to one or more test vectors;
   an output circuit configured to present data in a first mode and prevent presentation of data in a second mode, wherein the output circuit is configured to switch between the first mode and the second mode in response to a control signal; and
   a control circuit configured to generate the control signal according to predetermined criteria for protecting secure data within said apparatus while allowing said test data to be presented, wherein said control circuit comprises a state machine configured to control one or more output buffers of said output circuit.

2. The apparatus according to claim 1, wherein said apparatus comprises an integrated circuit.

3. The apparatus according to claim 1, wherein said apparatus comprises a secure electronic device.

4. The apparatus according to claim 1, wherein said test circuit comprises one or more scan chains.

5. The apparatus according to claim 1, wherein each of said one or more output buffers comprises a multiplexer circuit configured to select between a normal mode and a disabled mode of said output buffers in response to said control signal.

6. The apparatus according to claim 5, wherein inputs to each multiplexer circuit are hardwired to a predetermined value.

7. The apparatus according to claim 5, wherein inputs to each multiplexer circuit are programmable.

8. The apparatus according to claim 1, wherein said state machine comprises a counter.

9. The apparatus according to claim 8, wherein said control signal is asserted when said counter is reset and disasserted when said counter reaches a predetermined value.

10. The apparatus according to claim 9, wherein the predetermined value is programmable.

11. An apparatus comprising:
    means for generating test data in response to one or more test vectors;
    means for presenting data in a first mode and prevent presentation of data in a second mode, wherein the output circuit is configured to switch between the first mode and the second mode in response to a control signal; and
    means for generating the control signal according to predetermined criteria for protecting secure data within said apparatus while allowing said test data to be presented, wherein said apparatus is tested using one or more scan chains are connected to one or more output buffers.

12. A method to thoroughly test a secure electronic component using one or more scan chains comprising the steps of:
    generating test data in response to one or more test vectors;
    presenting data in a first mode and preventing presentation of data in a second mode;
    switching between the first mode and the second mode in response to a control signal; and
    generating the control signal according to predetermined criteria for protecting secure data within said secure electronic component while allowing the test data to be presented, wherein said one or more scan chains are connected to one or more output buffers.

13. The method according to claim 12, wherein said secure electronic component comprises an integrated circuit.

14. The method according to claim 12, wherein each of said one or more output buffers is configured to present data in a first mode, prevent presentation of data in a second mode and switch between the first mode and the second mode in response to the control signal.

15. The method according to claim 14, wherein each of said one or more output buffers comprises a multiplexer circuit configured to select between a normal mode and a disabled mode of said output buffers.

16. The method according to claim 15, wherein inputs to each multiplexer circuit are hardwired to a predetermined value.

17. The method according to claim 15, further comprising programming values for the inputs to each multiplexer circuit.

* * * * *